US011223363B2

(12) United States Patent
Min et al.

(10) Patent No.: US 11,223,363 B2
(45) Date of Patent: Jan. 11, 2022

(54) OPEN LOOP FRACTIONAL FREQUENCY DIVIDER (71) Applicant: REALTEK SEMICONDUCTOR CORPORATION, Hsinchu (TW)

(72) Inventors: Shawn Min, Hsinchu (TW); Yi-Jang Wu, Hsinchu (TW); Tsung-Ming Chen, Hsinchu (TW); Chieh-Yuan Hsu, Hsinchu (TW); Cheng-Yu Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/326,387

(22) Filed: May 21, 2021

(65) Prior Publication Data
US 2021/0376842 A1 Dec. 2, 2021

(30) Foreign Application Priority Data

May 28, 2020 (TW) ................... 109117900

(51) Int. Cl.
H03L 7/197 (2006.01)
H03L 7/081 (2006.01)

(52) U.S. Cl.
CPC .......... H03L 7/1974 (2013.01); H03L 7/0818 (2013.01)

(58) Field of Classification Search
CPC . H03L 7/0818; H03L 7/16; H03L 7/18; H03L 7/197; H03L 7/1974
See application file for complete search history.

(56) References Cited

U.S. PATENT DOCUMENTS

| 6,157,694 | A | 12/2000 | Larsson | |
| 7,054,404 | B2* | 5/2006 | Saeki | G06F 7/68 331/25 |
| 7,365,580 | B2* | 4/2008 | Martin | H03L 7/081 327/147 |
| 7,486,145 | B2* | 2/2009 | Floyd | H03L 7/1974 327/115 |
| 7,839,225 | B2 | 11/2010 | Huang | |
| 8,106,690 | B2* | 1/2012 | Sakaguchi | H03L 7/23 327/156 |
| 8,847,637 | B1 | 9/2014 | Guyton | |
| 9,099,959 | B2* | 8/2015 | Yamaji | H03B 19/14 |

* cited by examiner

Primary Examiner — Diana J. Cheng
(74) Attorney, Agent, or Firm — WPAT, PC (57) ABSTRACT Disclosed is an open loop fractional frequency divider including an integer divider, a control circuit, and a phase interpolator. The integer divider processes an input clock according to the setting of a target frequency to generate a first frequency-divided clock and a second frequency-divided clock. The control circuit generates a coarse-tune control signal and a fine-tune control signal according to the setting. The phase interpolator generates an output clock according to the first frequency-divided clock, the second frequency-divided clock, and the two control signals. The two control signals are used for determining a first current, and their reversed signals are used for determining a second current. The phase interpolator controls a contribution of the first (second) frequency-divided clock to the generation of the output clock according to the first (second) frequency-divided clock, the reversed signal of the first (second) frequency-divided clock, and the first (second) current.

10 Claims, 12 Drawing Sheets

OPEN LOOP FRACTIONAL FREQUENCY DIVIDER

BACKGROUND OF THE INVENTION

1. Field of the Invention

The present disclosure relates to a frequency divider, especially relates to an open loop fractional frequency divider.

2. Description of Related Art

Figure 1:
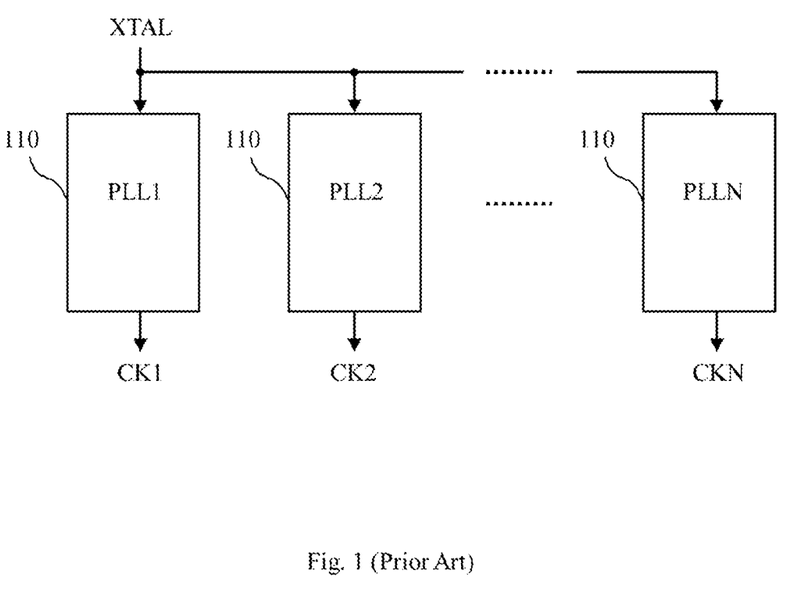
FIG. 1 shows a conventional frequency-divider technique.
Figure 2:
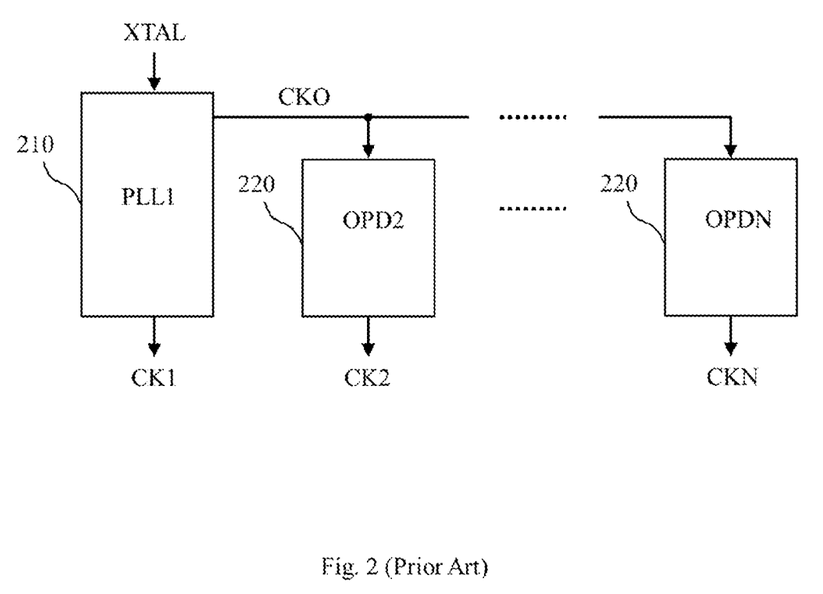
FIG. 2 shows another conventional frequency-divider technique.

Regarding general frequency dividers, two kinds of frequency-divider techniques are often used as described below:
(1) first kind of frequency-divider techniques: as shown in FIG. 1, this technique using a plurality of phase-locked loops 110 (PLL1, PLL2, . . . , PLLN) to generate a plurality of clocks (CK1, CK2, . . . , CKN) according to a predetermined reference clock (XTAL), respectively; each of the clocks (CK1, CK2, . . . , CKN) having a frequency being an integer/non-integer times the frequency of the reference clock in accordance with the designs of the phase-locked loops 110.
(2) second kind of frequency-divider techniques: as shown in FIG. 2, this technique including a phase-locked loop 210 (PLL1) and a plurality of open loop dividers 220 (OPD2, . . . , OPDN); the phase-locked loop 210 generating a clock (CK1) according to a predetermined reference clock (XTAL); the open loop dividers 220 generating a plurality of clocks (CK2, . . . , CKN) according to an output clock (CKO) of the phase-locked loop 210, respectively; each of the clocks (CK2, . . . , CKN) having a frequency being an integer/non-integer times the frequency of the output clock in accordance with the designs of the open loop dividers 220.

Regarding the first kind of frequency-divider techniques, it adopts a plurality of phase-locked loops and therefore requires a large circuit area, high cost, and great power consumption. Regarding the second kind of frequency-divider techniques, when any of the frequencies of the clocks (CK2, . . . , CKN) is a non-integer times the frequency of the output clock (CKO), this frequency is usually inaccurate.

SUMMARY OF THE INVENTION

An object of the present disclosure is to provide a cost-effective open loop fractional frequency divider having an accurate output.

An embodiment of the open loop fractional frequency divider of the present disclosure includes an integer divider, a control circuit, and a phase interpolator. The integer divider is configured to process an input clock according to the setting of a target frequency and thereby generate a first frequency-divided clock and a second frequency-divided clock. The control circuit is configured to generate a coarse-tune control signal and a fine-tune control signal according to the setting of the target frequency. The phase interpolator is configured to generate an output clock according to the first frequency-divided clock, the second frequency-divided clock, the coarse-tune control signal, and the fine-tune control signal, wherein the coarse-tune control signal and the fine-tune control signal are used for determining a first current, and a reversed signal of the coarse-tune control signal and a reversed signal of the fine-tune control signal are used for determining a second current. The phase interpolator is configured to control a contribution of the first frequency-divided clock to the generation of the output clock according to the first frequency-divided clock, a reversed signal of the first frequency-divided clock, and the first current; and the phase interpolator is further configured to control a contribution of the second frequency-divided clock to the generation of the output clock according to the second frequency-divided clock, a reversed signal of the second frequency-divided clock, and the second current. The coarse-tune control signal is used for determining a first current amount, the fine-tune control signal is used for determining a second current amount, and the first current amount is larger than the second current amount.

These and other objectives of the present invention will no doubt become obvious to those of ordinary skill in the art after reading the following detailed description of the preferred embodiments that are illustrated in the various figures and drawings.

BRIEF DESCRIPTION OF THE DRAWINGS

FIG. 8b shows an embodiment of the first coarse-tune current circuit and the first fine-tune current circuit of FIG. 8a.
FIG. 9b shows an embodiment of the second coarse-tune current circuit and the second fine-tune current circuit of FIG. 9a.

DETAILED DESCRIPTION OF THE PREFERRED EMBODIMENTS

The present disclosure discloses an open loop fractional frequency divider. This frequency divider is capable of fulfilling current control with different levels of precision, and is cost-effective and accurate at the frequency of an output clock.

Figure 3:
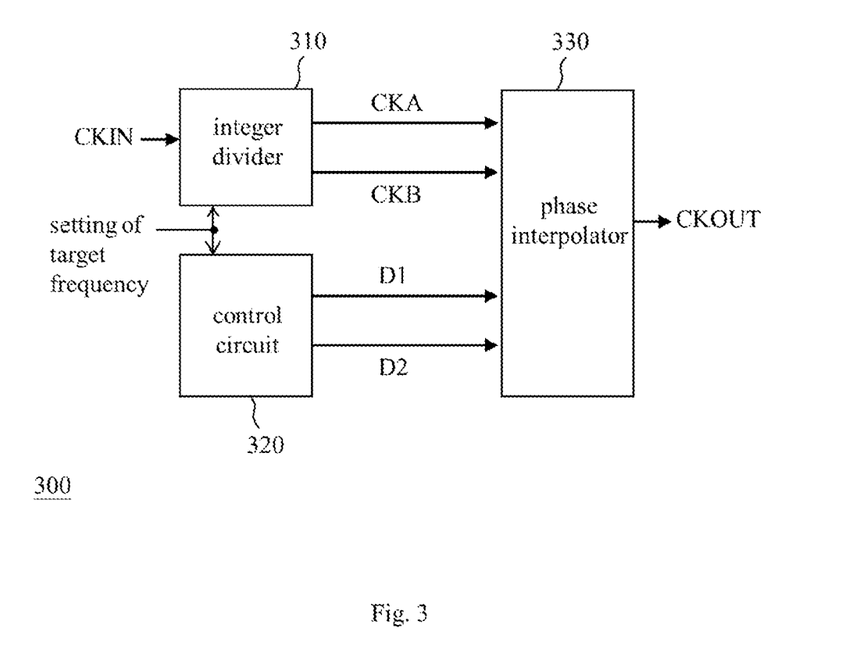
FIG. 3 shows an embodiment of the open loop fractional frequency divider of the present disclosure.

FIG. 3 shows an embodiment of the open loop fractional frequency divider of the present disclosure. The open loop fractional frequency divider 300 of FIG. 3 includes an integer divider 310, a control circuit 320, and a phase interpolator 330. These circuits are described in detail in the following paragraphs.

Figure 4:
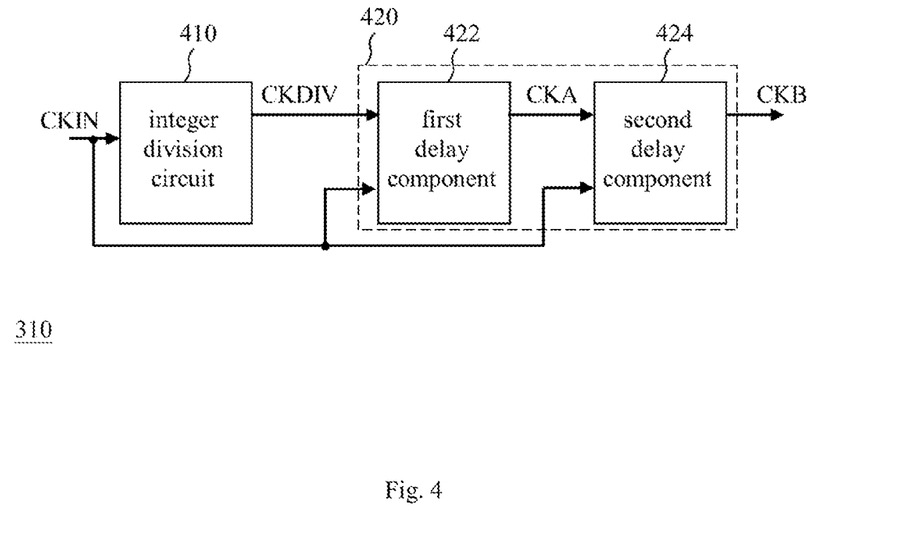
FIG. 4 shows an embodiment of the integer divider of FIG. 3.

Please refer to FIG. 3. The integer divider 310 is configured to process an input clock (CKIN) according to the setting of a target frequency, and thereby generate a first frequency-divided clock (CKA) and a second frequency-divided clock (CKB). The form (e.g., code form) and content of the setting of the target frequency can be determined according to the demand for implementation, and it falls beyond the discussion scope of the present disclosure. FIG. 4 shows an embodiment of the integer divider 310 of FIG. 3, which includes an integer division circuit 410 and a delay circuit 420. The integer division circuit 410 is configured to divide the input clock according to the setting of the target frequency and thereby generate a frequency-divided clock (CKDIV). The delay circuit 420 includes at least one delay component. In this embodiment, the delay circuit 420 includes a first delay component 422 (e.g., D-type flip-flop) and a second delay component 424 (e.g., D-type flip-flop); both the first delay component 422 and the second delay component 424 operate according to the input clock (CKIN), and are configured to output the first frequency-divided clock (CKA) and the second frequency-divided clock (CKB) according to the frequency-divided clock (CKDIV), wherein the frequency of the first frequency-divided clock is equivalent to the frequency of the second frequency-divided clock, but the phase of the first frequency-divided clock is different from the phase of the second frequency-divided clock.

Please refer to FIG. 3. The control circuit 320 is configured to generate a coarse-tune control signal (D1) (e.g., the multibit signal $I_{D1}[0]\sim I_{D1}[10]$ in FIG. 8b, wherein each bit is used for controlling the conduction state of a current path, that is to say controlling this current path to conduct electricity or to be shut off) and a fine-tune control signal (D2) (e.g., the multibit signal $I_{D2}[0]\sim I_{D2}[8]$ in FIG. 9b, wherein each bit is used for controlling the conduction state of a current path, that is to say controlling this current path to conduct electricity or to be shut off) according to the setting of the target frequency. The coarse-tune control signal and the fine-tune control signal are used for controlling the contribution of the first frequency-divided clock to the generation of the output clock, and also used for controlling the contribution of the second frequency-divided clock to the generation of the output clock; through the above-mentioned control, the frequency of the output clock is equivalent to or approaches the target frequency. In this embodiment, the more the contribution of the first frequency-divided clock to the generation of the output clock, the less the contribution of the second frequency-divided clock to the generation of the output clock; the sum of the two contributions is 100%. An embodiment of the control circuit 320 is a digital circuit based on a finite state machine (FSM) design; in this case, both the coarse-tune control signal and the fine-tune control signal are digital signals, and the values of the two control signals are determined according to the setting of the target frequency with known or self-developed techniques.

Please refer to FIG. 3. The phase interpolator 330 is configured to generate an output clock (CKOUT) according to the first frequency-divided clock, the second frequency-divided clock, the coarse-tune control signal, and the fine-tune control signal. The coarse-tune control signal (D1) and the fine-tune control signal (D2) are used for determining a first current ($I_1$). A reversed signal ($\overline{D1}$) (e.g., the multibit signal $\overline{I_{D1}[0]}\sim\overline{I_{D1}[10]}$ in FIG. 8b, wherein each bit is used for controlling the conduction state of a current path) of the coarse-tune control signal and a reversed signal ($\overline{D2}$) (e.g., the multibit signal $\overline{I_{D2}[0]}\sim\overline{I_{D2}[8]}$ in FIG. 9b, wherein each bit is used for controlling the conduction state of a current path) of the fine-tune control signal are used for determining a second current ($I_2$). The phase interpolator 330 is configured to control the contribution of the first frequency-divided clock (CKA) to the generation of the output clock according to the first frequency-divided clock (CKA) and the reversed signal thereof ($\overline{CKA}$), and the phase interpolator 330 is further configured to control the contribution of the second frequency-divided clock (CKB) to the generation of the output clock according to the second frequency-divided clock and the reversed signal thereof ($\overline{CKB}$). The current amount controlled by the coarse-tune control signal is larger than the current amount controlled by the fine-tune control signal, which can be achieved with known or self-developed techniques (e.g., the embodiments as shown in FIGS. 8a-9b). It should be noted that the fractional frequency divider 300 of FIG. 3 is an "open loop" frequency divider, and thus the input clock in FIG. 3 is generated without referring to the output clock in FIG. 3.

Figure 5:
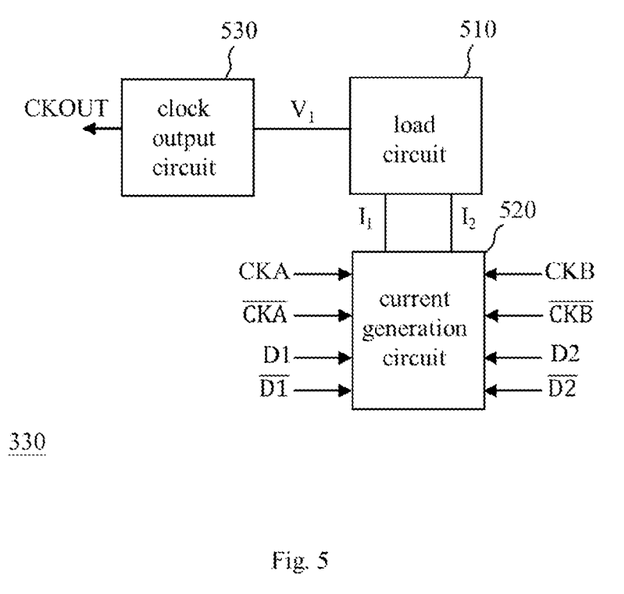
FIG. 5 shows an embodiment of the phase interpolator of FIG. 3.

FIG. 5 shows an embodiment of the phase interpolator 330 of FIG. 3 including a load circuit 510, a current generation circuit 520, and a clock output circuit 530. The load circuit 510 is configured to determine a control voltage ($V_1$) with the first current and the second current. The current generation circuit 520 is coupled to the load circuit 510, and configured to generate the first current and the second current. The clock output circuit 530 is coupled to the load circuit 510, and configured to provide the output clock according to the control voltage.

Figure 6:
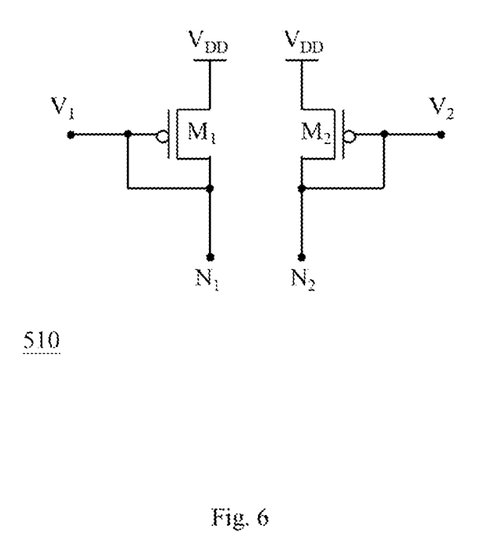
FIG. 6 shows an embodiment of the load circuit of FIG. 5.

FIG. 6 shows an embodiment of the load circuit 510 of FIG. 5 including a transistor pair composed of a first transistor ($M_1$) and a second transistor ($M_2$). Each of the first transistor and the second transistor is a diode-connected transistor, but the implementation of the present invention is not limited thereto. The first transistor is coupled to between a high voltage terminal ($V_{DD}$) and a first node ($N_1$), and the second transistor is coupled between the high voltage terminal and a second node ($N_2$). The voltage at the first node is the control voltage ($V_1$), and the voltage at the second node is another voltage ($V_2$) that can be determined according to the demand for implementation.

Figure 7:
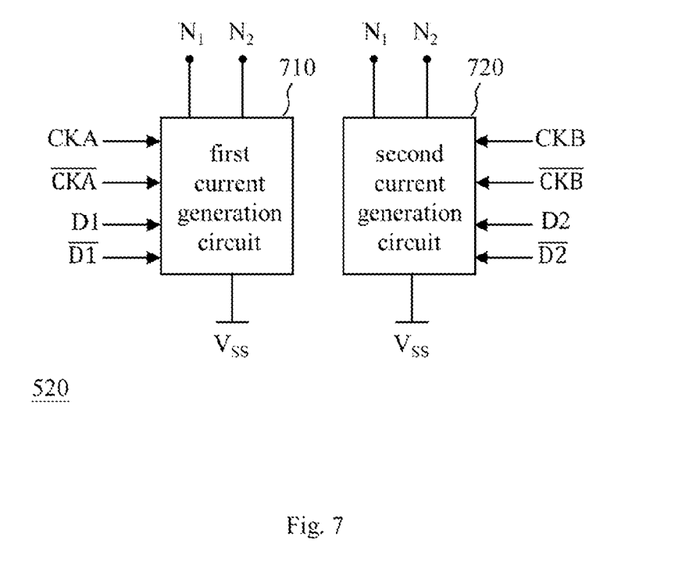
FIG. 7 shows an embodiment of the current generation circuit of FIG. 5.
Figure 8A:
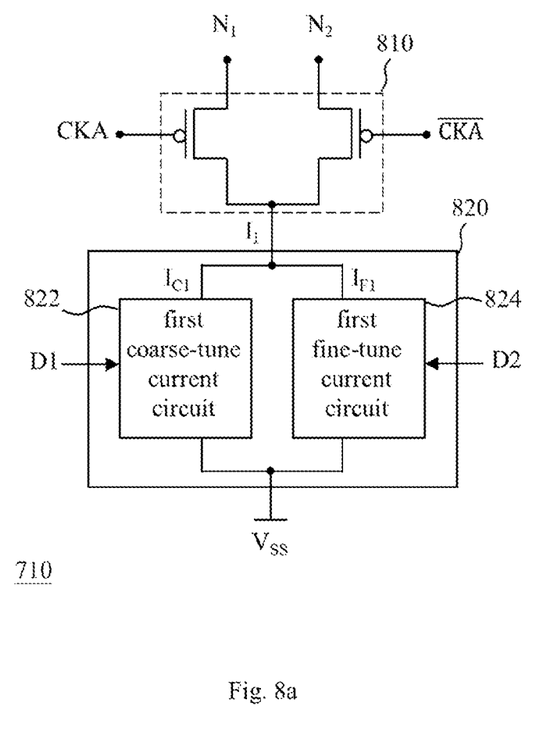
FIG. 8a shows an embodiment of the first current generation circuit of FIG. 7.
Figure 8B:
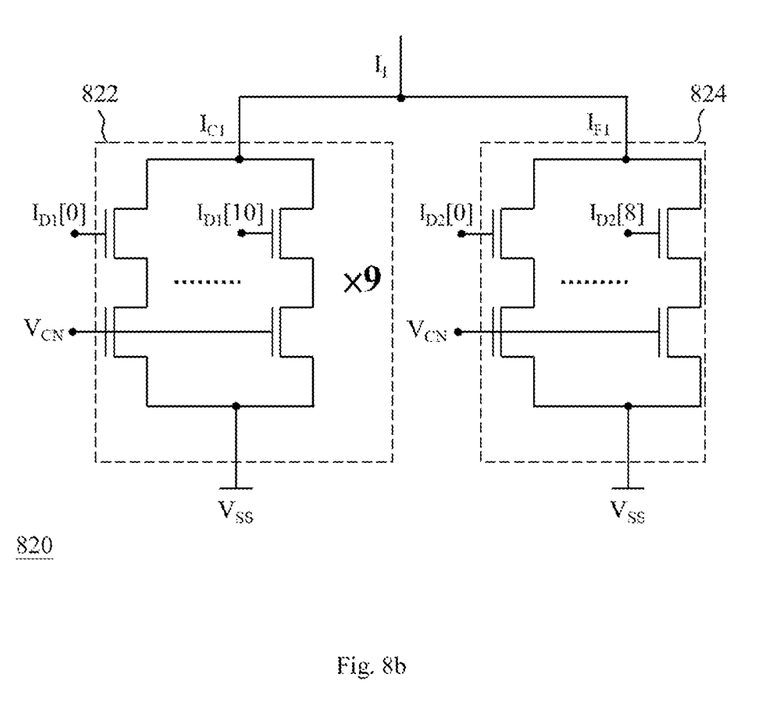

FIG. 7 shows an embodiment of the current generation circuit 520 of FIG. 5 including a first current generation circuit 710 and a second current generation circuit 720. An embodiment of the first current generation circuit 710 is shown in FIG. 8a, and includes a first input transistor pair 810 and a first current source circuit 820 (e.g., a group of current paths or an adjustable current source). The first input transistor pair 810 is coupled between the two nodes ($N_1$, $N_2$) and the first current source circuit 820, and configured to determine the conduction state of the first input transistor pair 810 according to the first frequency-divided clock and the reversed signal thereof. The first current source circuit 820 includes a first coarse-tune current circuit 822 (e.g., a group of current paths or an adjustable current source) and a first fine-tune current circuit 824 (e.g., a group of current paths or an adjustable current source). The first coarse-tune current circuit 822 is configured to provide a first coarse-tune current JO according to the coarse-tune control signal; the first fine-tune current circuit 824 is configured to provide a first fine-tune current ($I_{F1}$) according to the fine-tune control signal; and the sum of the first coarse-tune current ($I_{C1}$) and the first fine-tune current ($I_{F1}$) is equivalent to the first current ($I_1$). FIG. 8b shows an embodiment of the first coarse-tune current circuit 822 and the first fine-tune current circuit 824, wherein the voltage $V_{CN}$ is a bias that is determined according to the demand for implementation. The first coarse-tune current circuit 822 includes nine sets of circuits that are identical in configuration; the label "×9" in FIG. 8b is indicative of the nine sets of circuits, and is used for preventing the drawing from being too complicated; and each of the nine sets of circuits includes P current paths (e.g., the eleven current paths controlled by the signals $I_{D1}[0]\sim I_{D1}$

[10] in FIG. 8b) coupled in parallel, wherein the number "P" is an integer greater than one. The first fine-tune current circuit 824 includes Q current paths (e.g., the nine current paths controlled by the signals $I_{D2}[0]$~$I_{D2}[8]$ in FIG. 8b) coupled in parallel, wherein the number "Q" is an integer greater than one. The coarse-tune control signal is used for allowing K current path(s) of the P current paths in each of the nine sets of circuits to conduct electricity, that is to say 9×K current paths of the 9×P current paths being used for conducting electricity according to the coarse-tune control signal; the fine-tune control signal is used for allowing L current path(s) of the Q current paths to conduct electricity; each of the numbers "K" and "L" is a non-negative integer, the number "K" is not greater than the number "P", and the number "L" is not greater than the number "Q". It should be noted that the greater the number "K" and/or the number "L" is, the greater the sum of the current of the K current paths and/or the L current paths is; as the sum increases, the contribution of the first frequency-divided clock to the generation of the output clock increases proportionally, and the frequency/phase of the output clock gets closer to the frequency/phase of the first frequency-divided clock.

Figure 9A:
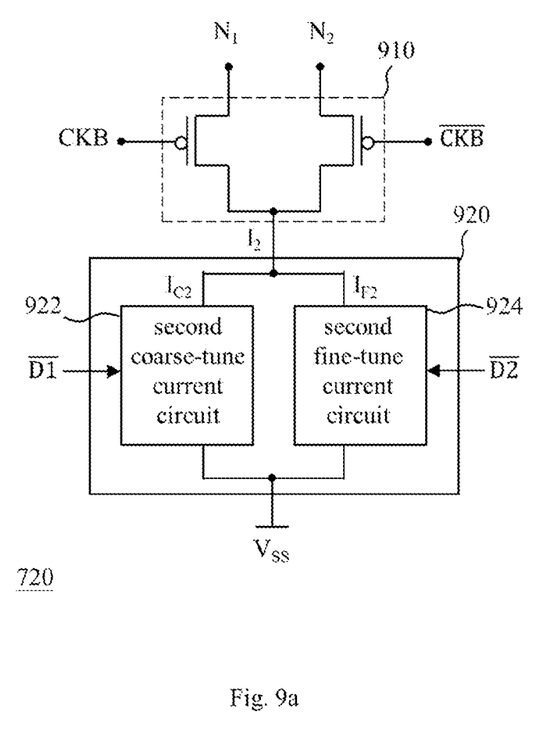
FIG. 9a shows an embodiment of the second current generation circuit of FIG. 7.
Figure 9B:
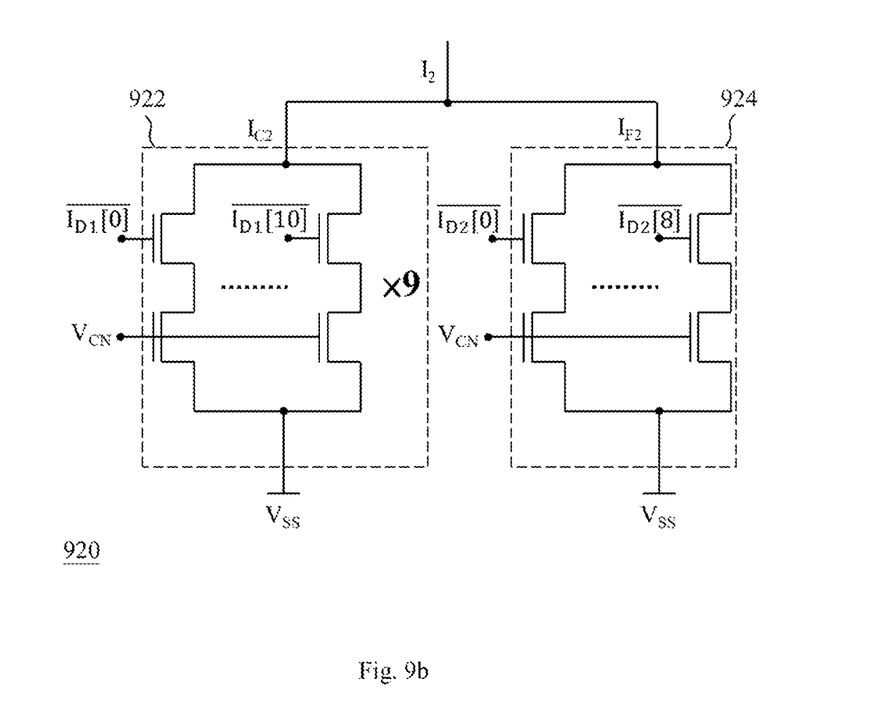

An embodiment of the second current generation circuit 720 is shown in FIG. 9a, and includes a second input transistor pair 910 and a second current source circuit 920 (e.g., a group of current paths or an adjustable current source). The second input transistor pair 910 is coupled between the load circuit 510 and the second current source circuit 920, and configured to determine the conduction state of the second input transistor pair 910 according to the second frequency-divided clock and the reversed signal thereof. The second current source circuit 920 includes a second coarse-tune current circuit 922 (e.g., a group of current paths or an adjustable current source) and a second fine-tune current circuit 924 (e.g., a group of current paths or an adjustable current source). The second coarse-tune current circuit 922 is configured to provide a second coarse-tune current ($I_{C2}$) according to the reversed signal of the coarse-tune control signal; the second fine-tune current circuit 924 is configured to provide a second fine-tune current ($I_{F2}$) according to the reversed signal of the fine-tune control signal; and the sum of the second coarse-tune current and the second fine-tune current is equivalent to the second current ($I_2$). FIG. 9b shows an embodiment of the second coarse-tune current circuit 922 and the second fine-tune current circuit 924. The second coarse-tune current circuit 922 includes nine sets of circuits that are identical in configuration; the label "×9" in FIG. 9b is indicative of the nine sets of circuits; and each of the nine sets of circuits includes P current paths coupled in parallel. The second fine-tune current circuit 924 includes Q current paths coupled in parallel. The reversed signal of the coarse-tune control signal is used for allowing (P-K) current path(s) of the P current paths in each of the nine sets of circuits to be electrically conductive, and the reversed signal of the fine-tune control signal is used for allowing (Q-L) current path(s) of the Q current paths to be electrically conductive. It should be noted that the smaller the number "K" and/or the number "L" is, the greater the sum of the current of the (P-K) current paths and/or the (Q-L) current paths is; as the sum increases, the contribution of the second frequency-divided clock to the generation of the output clock increases proportionally, and the frequency/phase of the output clock gets closer to the frequency/phase of the second frequency-divided clock.

In an exemplary implementation, each of the P current paths in FIG. 8b/9b and a first reference current circuit (not shown in the figure) form a current mirror jointly, so that the current of each electrically conductive path among the P current paths is a mirrored current of a first reference current of the first reference current circuit, in which the amount of the first reference current is dependent on the demand for implementation. Similarly, each of the Q current paths in FIG. 8b/9b and a second reference current circuit (not shown in the figure) form a current mirror jointly, so that the current of each electrically conductive path among the Q current paths is a mirrored current of a second reference current of the second reference current circuit, in which the amount of the second reference current is dependent on the demand for implementation. Since the implementation of a current mirror is well known in this technical field, its detail is omitted here. In an exemplary implementation, the first reference current is not smaller than ten times the second reference current, and thus the first coarse-tune current ($I_{C1}$) is not smaller than ten times the first fine-tune current ($I_{F1}$) and the second coarse-tune current ($I_{C2}$) is not smaller than ten times the second fine-tune current ($I_{C2}$). In an exemplary implementation, the ratio of the frequency of the input clock to the frequency of the first/second frequency-divided clock is equal to N, and the frequency of the output clock is dependent on an equation as follows:

$$\frac{\text{the frequency of the input clock}}{N} \times \frac{1}{1 + \frac{1}{N} \times \left(\frac{K}{P} + \frac{L}{P \times Q}\right)}.$$

Examples of the target frequency, the frequency of the input clock, the frequency of the first/second frequency-divided clock, and the frequency of the output clock are illustrated with the Table 1 below, and these examples are for understanding without any intention to limit the scope of the present invention thereto.

TABLE 1

| target frequency (MHz) | frequency of input clock (MHz) | frequency of first/second frequency-divided clock (MHz) | frequency of output clock (MHz) = $\frac{\text{frequency of intput clock}}{N} \times \frac{1}{1 + \frac{1}{N} \times \left(\frac{K}{P} + \frac{L}{P \times Q}\right)}$ |
|---|---|---|---|
| 432 | 6000 | 6000/13 | $\frac{6000}{13} \times \frac{1}{1 + \frac{1}{13} \times \left(\frac{9}{11} + \frac{7}{99}\right)}$ |
| 540 | 6000 | 6000/11 | $\frac{6000}{11} \times \frac{1}{1 + \frac{1}{11} \times \left(\frac{1}{11} + \frac{2}{99}\right)}$ |

TABLE 1-continued

| target frequency (MHz) | frequency of input clock (MHz) | frequency of first/second frequency-divided clock (MHz) | frequency of output clock (MHz) = frequency of input clock $\times \dfrac{1}{1 + \dfrac{1}{N} \times \left(\dfrac{K}{P} + \dfrac{L}{P \times Q}\right)}$ |
|---|---|---|---|
| 648 | 6000 | 6000/9 | $\dfrac{6000}{9} \times \dfrac{1}{1 + \dfrac{1}{9} \times \left(\dfrac{2}{11} + \dfrac{8}{99}\right)}$ |
| 594 | 6000 | 6000/10 | $\dfrac{6000}{10} \times \dfrac{1}{1 + \dfrac{1}{10} \times \left(\dfrac{1}{11} + \dfrac{1}{99}\right)}$ |
| 742.5 | 6000 | 6000/8 | $\dfrac{6000}{8} \times \dfrac{1}{1 + \dfrac{1}{8} \times \left(\dfrac{0}{11} + \dfrac{8}{99}\right)}$ |
| 891 | 6000 | 6000/6 | $\dfrac{6000}{6} \times \dfrac{1}{1 + \dfrac{1}{6} \times \left(\dfrac{9}{11} + \dfrac{1}{99}\right)}$ |
| 792 | 6000 | 6000/7 | $\dfrac{6000}{7} \times \dfrac{1}{1 + \dfrac{1}{7} \times \left(\dfrac{6}{11} + \dfrac{3}{99}\right)}$ |
| 464.0625 | 6000 | 6000/12 | $\dfrac{6000}{12} \times \dfrac{1}{1 + \dfrac{1}{12} \times \left(\dfrac{10}{11} + \dfrac{2}{99}\right)}$ |
| 371.25 | 6000 | 6000/16 | $\dfrac{6000}{16} \times \dfrac{1}{1 + \dfrac{1}{16} \times \left(\dfrac{1}{11} + \dfrac{7}{99}\right)}$ |

Figure 10:
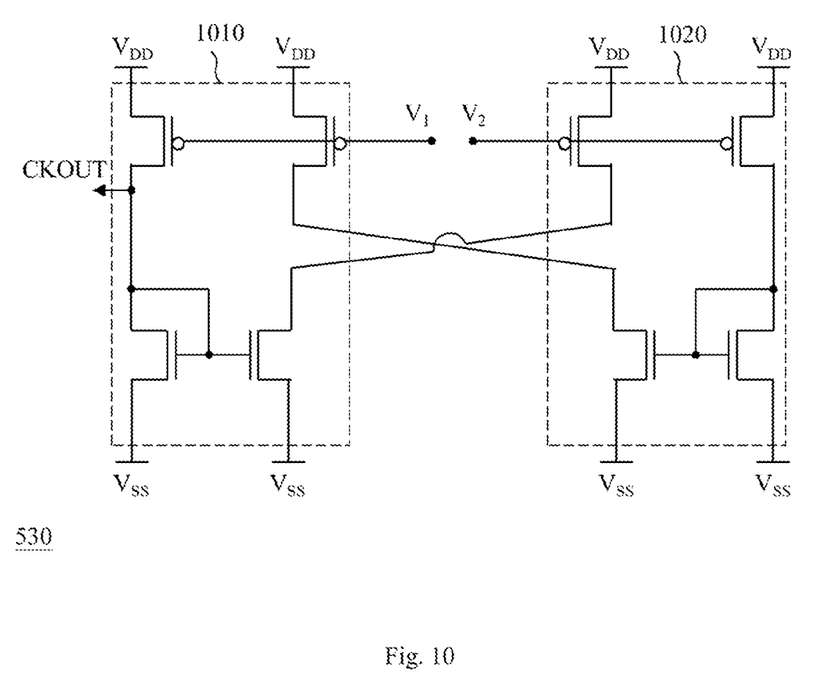
FIG. 10 shows a clock output circuit of FIG. 5.

FIG. 10 shows an embodiment of the clock output circuit 530 of FIG. 5 including a first current mirror circuit 1010 and a second current mirror circuit 1020. Please refer to FIG. 10 and FIG. 6. The first current mirror circuit 1010 is coupled between the load circuit 510 and the second current mirror circuit 1020, and configured to provide the output clock (CKOUT) according to the control voltage ($V_1$). The second current mirror circuit 1020 is coupled between the load circuit 510 and the first current mirror circuit 1010. Since the operation and characteristics of a current mirror circuit are well known in this technical field, its detail is omitted here.

It should be noted that people of ordinary skill in the art can selectively use some or all of the features of any embodiment in this specification or selectively use some or all of the features of multiple embodiments in this specification to implement the present invention as long as such implementation is practicable, which implies that the way to implement the present invention can be flexible.

To sum up, the open loop fractional frequency divider of the present disclosure is capable of fulfilling current control with different levels of precision, and is cost-effective and accurate at the frequency of an output clock.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An open loop fractional frequency divider, comprising:
an integer divider configured to process an input clock according to setting of a target frequency and thereby generate a first frequency-divided clock and a second frequency-divided clock;
a control circuit configured to generate a coarse-tune control signal and a fine-tune control signal according to the setting of the target frequency, wherein the coarse-tune control signal is used for determining a first current amount, the fine-tune control signal is used for determining a second current amount, and the first current amount is larger than the second current amount; and
a phase interpolator configured to generate an output clock according to the first frequency-divided clock, the second frequency-divided clock, the coarse-tune control signal, and the fine-tune control signal,
wherein the coarse-tune control signal and the fine-tune control signal are used for determining a first current; a reversed signal of the coarse-tune control signal and a reversed signal of the fine-tune control signal are used for determining a second current; the phase interpolator is configured to control a contribution of the first frequency-divided clock to a generation of the output clock according to the first frequency-divided clock, a reversed signal of the first frequency-divided clock, and the first current; and the phase interpolator is further configured to control a contribution of the second frequency-divided clock to the generation of the output clock according to the second frequency-divided clock, a reversed signal of the second frequency-divided clock, and the second current.

2. The open loop fractional frequency divider of claim 1, wherein the integer divider includes:
an integer division circuit configured to divide the input clock according to the setting of the target frequency and thereby generate a frequency-divided clock; and
a delay circuit configured to receive the frequency-divided clock to output the first frequency-divided clock and the second frequency-divided clock, wherein a frequency of the first frequency-divided clock is equivalent to a frequency of the second frequency-divided clock, and a phase of the first frequency-divided clock is different from a phase of the second frequency-divided clock.

3. The open loop fractional frequency divider of claim 2, wherein the delay circuit operates according to the input clock.

4. The open loop fractional frequency divider of claim 1, wherein the phase interpolator includes:
a load circuit configured to determine a control voltage with the first current and the second current;
a current generation circuit including:
a first current generation circuit including:
a first input transistor pair coupled between the load circuit and a first current source circuit, and configured to determine a conduction state of the first input transistor pair according to the first frequency-divided clock and the reversed signal of the first frequency-divided clock; and
the first current source circuit including:
a first coarse-tune current circuit configured to provide a first coarse-tune current according to the coarse-tune control signal; and
a first fine-tune current circuit configured to provide a first fine-tune current according to the fine-tune control signal, in which a sum of the first coarse-tune current and the first fine-tune current is equivalent to the first current;
a second current generation circuit including:
a second input transistor pair coupled between the load circuit and a second current source circuit, and configured to determine a conduction state of the second input transistor pair according to the second frequency-divided clock and the reversed signal of the second frequency-divided clock; and
the second current source circuit including:
a second coarse-tune current circuit configured to provide a second coarse-tune current according to the reversed signal of the coarse-tune control signal; and
a second fine-tune current circuit configured to provide a second fine-tune current according to the reversed signal of the fine-tune control signal, in which a sum of the second coarse-tune current and the second fine-tune current is equivalent to the second current; and
a clock output circuit coupled to the load circuit, and configured to provide the output clock according to the control voltage.

5. The open loop fractional frequency divider of claim 4, wherein the clock output circuit includes a first current mirror circuit and a second current mirror circuit; the first current mirror circuit is coupled between the load circuit and the second current mirror circuit, and configured to provide the output clock according to the control voltage; and the second current mirror circuit is coupled between the load circuit and the first current mirror circuit.

6. The open loop fractional frequency divider of claim 4, wherein the first coarse-tune current is not smaller than ten times the first fine-tune current, and the second coarse-tune current is not smaller than ten times the second fine-tune current.

7. The open loop fractional frequency divider of claim 4, wherein the first coarse-tune current circuit includes $Q_1$ sets of circuits coupled in parallel, and each of the $Q_1$ sets of circuits includes $P_1$ current paths coupled in parallel; the first fine-tune current circuit includes $Q_1$ current paths coupled in parallel; the coarse-tune control signal is used for allowing $K_1$ current path(s) of the $P_1$ current paths in each of the $Q_1$ sets of circuits to conduct electricity; the fine-tune control signal is used for allowing $L_1$ current path(s) of the $Q_1$ current paths to conduct electricity; the second coarse-tune current circuit includes $Q_2$ sets of circuits coupled in parallel, and each of the $Q_2$ sets of circuits includes $P_2$ current paths coupled in parallel; the second fine-tune current circuit includes $Q_2$ current paths coupled in parallel; the reversed signal of the coarse-tune control signal is used for allowing $K_2$ current path(s) of the $P_2$ current paths in each of the $Q_2$ sets of circuits to conduct electricity; the reversed signal of the fine-tune control signal is used for allowing $L_2$ current path(s) of the $Q_2$ current paths to conduct electricity; each of the $P_1$ and the $P_2$ is equal to P, each of the $Q_1$ and the $Q_2$ is equal to Q, the $K_1$ is equal to K, the $K_2$ is equal to (P-K), the $L_1$ is equal to L, the $L_2$ is equal to (Q-L), each of the P and the Q is an integer greater than one, each of the K and the L is a non-negative integer, the K is not greater than the P, and the L is not greater than the Q.

8. The open loop fractional frequency divider of claim 7, wherein a ratio of a frequency of the input clock to a frequency of the first frequency-divided clock is equal to N, and the frequency of the output clock is dependent on an equation as follows:

$$\frac{\text{the frequency of the input clock}}{N} \times \frac{1}{1 + \frac{1}{N} \times \left(\frac{K}{P} + \frac{L}{P \times Q}\right)}.$$

9. The open loop fractional frequency divider of claim 1, wherein the input clock is generated without referring to the output clock.

10. The open loop fractional frequency divider of claim 1, wherein the control circuit is a digital circuit based on a finite state machine design, and both the coarse-tune control signal and the fine-tune control signal are digital signals.

* * * * *